United States Patent
Chuang et al.

(10) Patent No.: US 8,138,554 B2
(45) Date of Patent: Mar. 20, 2012

(54) SEMICONDUCTOR DEVICE WITH LOCAL INTERCONNECTS

(75) Inventors: Harry Chuang, Austin, TX (US); Kong-Beng Thei, Hsinchu County (TW); Sheng-Chen Chung, Hsinchu (TW); Mong-Song Liang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 465 days.

(21) Appl. No.: 12/212,034

(22) Filed: Sep. 17, 2008

(65) Prior Publication Data

US 2010/0065921 A1 Mar. 18, 2010

(51) Int. Cl.
H01L 29/76 (2006.01)
H01L 29/94 (2006.01)
H01L 31/062 (2012.01)
H01L 31/113 (2006.01)
H01L 31/119 (2006.01)

(52) U.S. Cl. ............................ 257/383; 257/E29.255
(58) Field of Classification Search ............... 257/233, 257/202–211, E27.081, E29.064, E27.014, 257/E27.06–E27.067, 383, E29.255
See application file for complete search history.

(56) References Cited

U.S. PATENT DOCUMENTS

| | | | |
|---|---|---|---|
| 2006/0163665 A1* | 7/2006 | Chuang et al. | 257/374 |
| 2007/0181942 A1* | 8/2007 | Knoblinger et al. | 257/336 |
| 2007/0200173 A1* | 8/2007 | Pelley et al. | 257/347 |
| 2008/0232170 A1* | 9/2008 | Deppe et al. | 365/185.17 |

FOREIGN PATENT DOCUMENTS

KR 2004-0025641 3/2004

OTHER PUBLICATIONS

Korean language office action dated Mar. 30, 2011.
English language translation of office action.
English language translation of abstract of KR 2004-0025641 (published Mar. 24, 2004).

* cited by examiner

*Primary Examiner* — David S Blum
(74) *Attorney, Agent, or Firm* — Thomas|Kayden

(57) ABSTRACT

A semiconductor device with local interconnects is provided. The semiconductor device comprises a first gate line structure and a second gate line structure disposed on a substrate and substantially collinear. A first pair of source/drain regions is formed in the substrate on both sides of the first gate line structure and a second pair of source/drain regions is formed in the substrate on both sides of the second gate line structure. A pair of conductive lines is disposed on the substrate on both sides of the first gate line structure and the second gate line structure, such that each conductive line is connected to one of the first pair of source/drain regions and one of the second pair of source/drain regions.

11 Claims, 2 Drawing Sheets

SEMICONDUCTOR DEVICE WITH LOCAL INTERCONNECTS

BACKGROUND OF THE INVENTION

1. Field of the Invention

The invention relates to semiconductor technology and in particular to a semiconductor device with local interconnects having low contact resistance.

2. Description of the Related Art

For the fabrication of semiconductor integrated circuits, the size of semiconductor devices in the integrated circuits, such as transistors, resistors, capacitors or other semiconductor elements well known in the art, has been continuously reduced in order to increase device density. Accordingly, a multi-layered interconnect structure is typically required for electrical connection of the individual semiconductor devices. Along with reduction in the size and dimension of semiconductor devices, more components are being placed on an integrated circuit or die, which increases design complexity of the multi-layered interconnect structure.

Typically, the multi-layered interconnect structure comprises plugs and metal layers, which are provided by a conventional dual damascene process. In the dual damascene process, via openings are first anisotropically etched through an inter-metal dielectric (IMD)/interlayer dielectric (ILD) layer by a conventional photolithography and etching process. A second anisotropically etched opening referred to as a trench opening is then formed overlying one or more of the via openings by a second photolithography and etching process. The via openings and the trench opening together makeup the dual damascene structure which is subsequently filled with metal to form plugs and metal layers. As the size and dimension of semiconductor devices are reduced, the size of plugs is also reduced, thus increasing the aspect ratio of the via openings, which decreases fabrication yields. Aspect ratio is defined herein as the height/width ratio of the via opening. As the aspect ratio increases, the contact resistance of the plugs increases. Accordingly, as device density increases, it becomes more difficult to maintain or increase the electrical properties and the reliability of the devices.

Therefore, there exists a need for an improved interconnect structure, which is capable of reducing contact resistance as the size of a device is reduced to increase device density.

BRIEF SUMMARY OF INVENTION

A detailed description is given in the following embodiments with reference to the accompanying drawings. A semiconductor device with local interconnects is provided. An embodiment of a semiconductor device with local interconnects comprises a first gate line structure and a second gate line structure disposed on a substrate and substantially collinear. A first pair of source/drain regions is formed in the substrate on both sides of the first gate line structure and a second pair of source/drain regions is formed in the substrate on both sides of the second gate line structure. A pair of conductive lines is disposed on the substrate on both sides of the first gate line structure and the second gate line structure, such that each conductive line is connected to one of the first pair of source/drain regions and one of the second pair of source/drain regions.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Embodiments of a semiconductor device with local interconnects is described with reference to the accompanying drawings.

Figure 1:
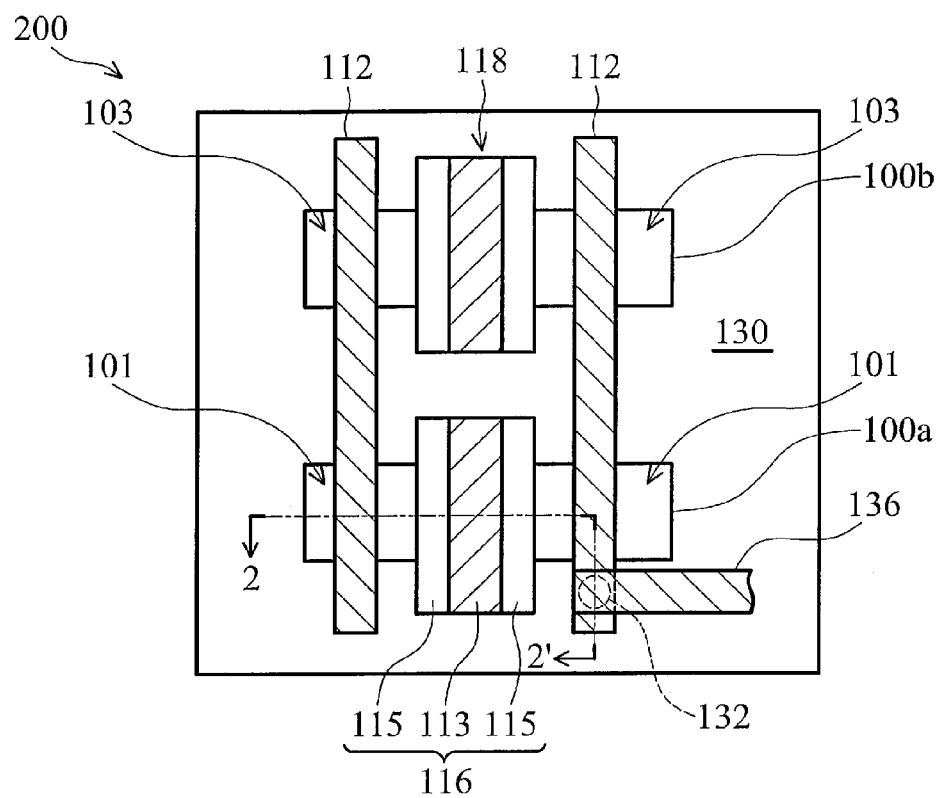
FIG. 1 is a plan view of an embodiment of a semiconductor device with local interconnects according to the invention.
Figure 2:
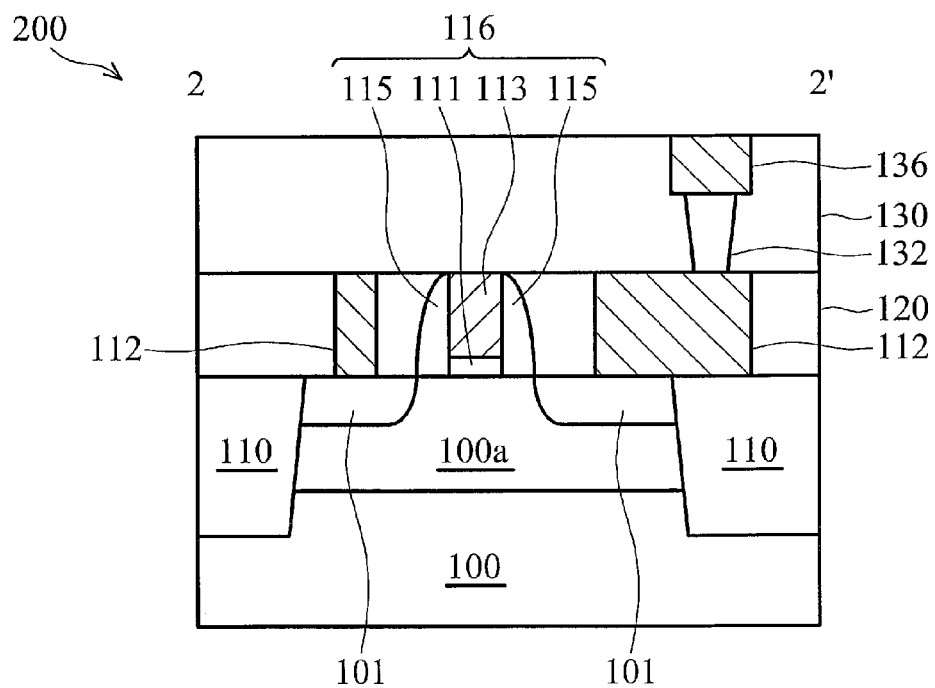
FIG. 2 is a cross section along line 2-2' shown in FIG. 1.

FIGS. 1 and 2 illustrate an embodiment of a semiconductor device with local interconnects, in which FIG. 1 is a plan view and FIG. 2 is a cross section along line 2-2' shown in FIG. 1. Referring to FIGS. 1 and 2, the semiconductor device 200 comprises a substrate 100, such as a silicon substrate or other semiconductor substrates. The substrate 100 may contain a variety of elements (not shown), including transistors, resistors, and other semiconductor elements which are well known in the art. In the embodiment, the substrate has at least two active areas 100a and 100b separated from each other and surrounded by an isolation structure 110, for example, a shallow trench isolation (STI) structure.

A dielectric layer 120 is formed overlying the substrate 100, used as an ILD layer. The dielectric layer 120 may be silicon dioxide, phosphosilicate glass (PSG), borophosphosilicate glass (BPSG) or low dielectric constant (k) material, such as fluorosilicate glass (FSG) or organosilicate glass (OSG). A first gate line structure 116 is disposed in the dielectric layer 120 and on the substrate 100 of the active area 100a. A second gate line structure 118 is disposed in the dielectric layer 120 and on the substrate 100 of the active area 100b. In the embodiment, the first gate line structure 116 and the second gate line structure 118 are separated from each other and substantially arranged collinear. Each of the first gate line structure 116 and the second gate line structure 118 may comprise a gate dielectric layer 111 on the substrate 100 of corresponding active areas. A gate electrode 113, such as a polysilicon, is disposed on the gate dielectric layer 111 and may be covered by a cap layer (not shown), such as a silicon nitride layer. Gate spacers 115 are disposed on sidewalls of the gate electrode 113.

Figure 3:
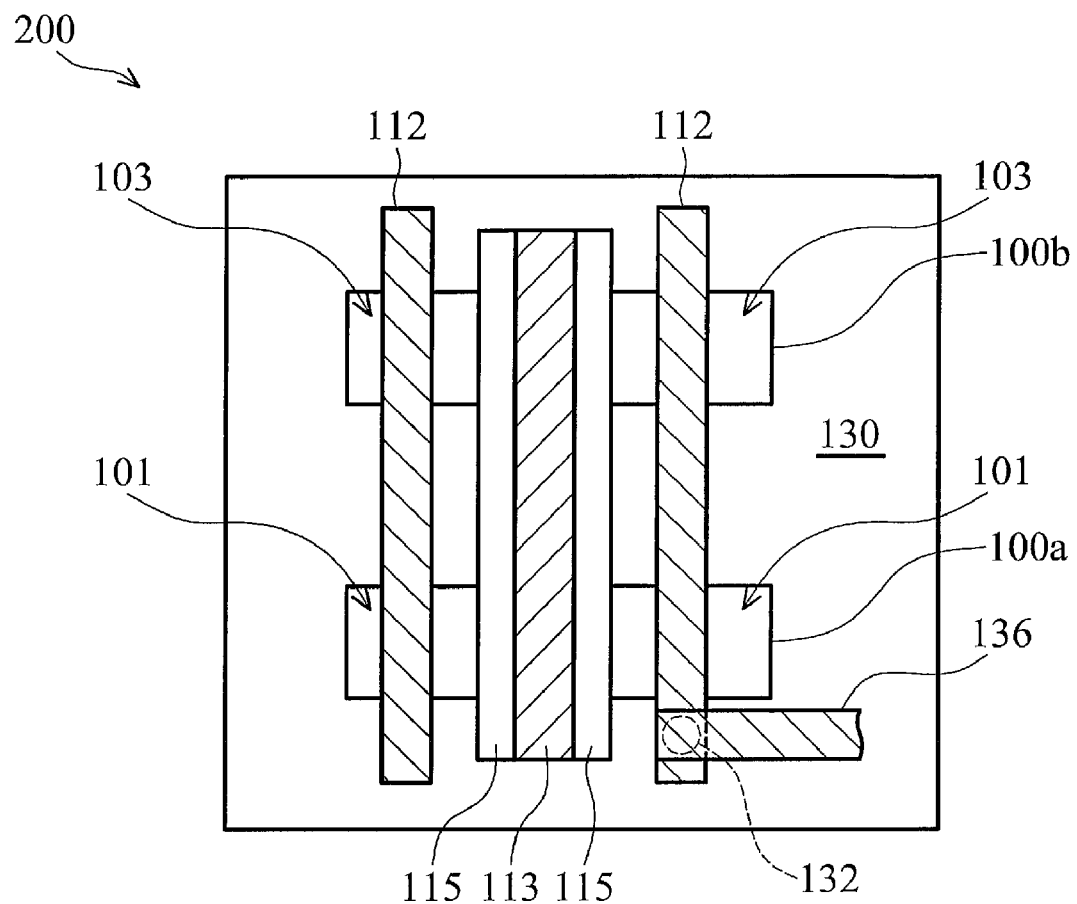
FIG. 3 is a plan view of another embodiment of a semiconductor device with local interconnects according to the invention.

A first pair of source/drain regions 101 is formed in the substrate 100 of the first active area 100a and located on both sides of the first gate line structure 116. A second pair of source/drain regions 103 is formed in the substrate 100 of the second active area 100b and located on both sides of the second gate line structure 118. As a result, two transistors are formed on the first and second active areas 100a and 100b, respectively. In the embodiment, the first pair of source/drain regions 101 and the second pair of source/drain regions 103 may have the same conductivity type, such as N-type or P-type, or have different conductivity types. For example, if the first pair of source/drain regions 101 and the second pair of source/drain regions 103 have the same conductivity type, the gate electrodes 113 of the first gate line structure 116 and the second gate line structure 118 would merge with each other to form a common gate line structure, as shown in FIG. 3.

A pair of conductive lines 112 is disposed in the dielectric layer 120 and on the substrate 100 on both sides of the first gate line structure 116 and the second gate line structure 118, such that the pair of conductive lines 112 is at the same level as the gate electrodes 113 and each conductive line 112 serves as a local interconnect to electrically connect one of the first pair of source/drain regions 101 and one of the second pair of source/drain regions 103 on the same side of the first gate line structure 116 and the second gate line structure 118. In the embodiment, the pair of conductive lines 112 may comprise tungsten, copper, or aluminum. Moreover, each conductive line 112 is substantially parallel to the first gate line structure 116 and the second gate line structure 118. That is, the conductive line 112 and the first gate line structure 116 and the second gate line structure 118 are extended along the same direction.

A dielectric layer 130 is formed overlying the dielectric layer 120 and the pair of conductive lines 112, used as an IMD layer. The dielectric layer 130 may be a single layer or a multi-layered structure. Moreover, the dielectric layer 130 may comprise the same or similar material as the dielectric layer 120. At least one conductive plug 132, such as a tungsten or copper plug, is disposed in the dielectric layer 130 and above one of the pair of conductive lines 112, to be connected thereto. A metal layer 136, such as a copper layer, is disposed in the dielectric layer 130 and above the conductive plug 132, to be electrically connected to the two transistors via the conductive plug 132 and the conductive line 112 thereunder.

According to the invention, since the two transistors formed on the first and second active areas 100a and 100b are electrically connected to each other by the conductive line 112, which provides a larger contact area than that of conventional conductive plugs, the contact resistance of the conductive line 112 is lower than that of conventional conductive plugs. That is, device density for semiconductor devices can further be reduced due to the lower contact resistance of the conductive line 112 serving as a local interconnect, when compared to using conventional conductive plugs. Moreover, since the gate electrode lines 113 for the two transistors are collinear (i.e., the gate electrodes 113 extend along a single straight line), the process for formation of the source/drain regions 101 and 103 is relatively simple. Furthermore, since the collinear gate electrodes 113 can be formed by patterning a single conductive layer along only one dimension, good critical dimension (CD) control during the lithography process can be obtained. Additionally, since the gate electrodes 113 and the conductive lines 112 are parallel, the layout is also relatively simple. Moreover, layouts in accordance with the invention can result in a relatively high density transistor layout.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device with local interconnects, comprising:
   a first gate line structure and a second gate line structure disposed on a substrate and substantially collinear;
   a first pair of source/drain regions formed in the substrate on both sides of the first gate line structure and a second pair of source/drain regions formed in the substrate on both sides of the second gate line structure; and
   a pair of conductive lines disposed on the substrate on the both sides of the first gate line structure and the second gate line structure, such that each conductive line has first and second portions in direct contact with and across one of the first pair of source/drain regions and one of the second pair of source/drain regions, respectively, for electrical connection therebetween.

2. The semiconductor device as claimed in claim 1, wherein each of the first gate line structure and the second gate line structure comprises:
   a gate dielectric layer disposed on the substrate;
   a gate electrode disposed on the gate dielectric layer; and
   a gate spacer disposed on a sidewall of the gate electrode.

3. The semiconductor device as claimed in claim 2, wherein the gate electrode comprises polysilicon.

4. The semiconductor device as claimed in claim 2, wherein the pair of conductive lines is at the same level as the gate electrode, such that each conductive line has a top surface coplanar with that of the gate electrode.

5. The semiconductor device as claimed in claim 2, wherein the first and second pairs of source/drain regions have the same conductivity type.

6. The semiconductor device as claimed in claim 5, wherein the gate electrodes of the first gate line structure and the second gate line structure are merged with each other.

7. The semiconductor device as claimed in claim 1, wherein the first and second pairs of source/drain regions have different conductivity types.

8. The semiconductor device as claimed in claim 1, wherein the pair of conductive lines is substantially parallel to the first gate line structure and the second gate line structure.

9. The semiconductor device as claimed in claim 1, wherein the pair of conductive lines comprises tungsten.

10. The semiconductor device as claimed in claim 1, further comprising:
    at least one conductive plug disposed on the pair of conductive lines and connected to one of the pair of conductive lines; and
    a metal layer disposed on the conductive plug and connected thereto.

11. The semiconductor device as claimed in claim 1, wherein the first gate line structure is separated from the second gate line structure.

* * * * *